United States Patent
Hong et al.

(10) Patent No.: US 7,608,485 B2
(45) Date of Patent: Oct. 27, 2009

(54) HIGHLY RELIABLE, COST EFFECTIVE AND THERMALLY ENHANCED AUSN DIE-ATTACH TECHNOLOGY

(75) Inventors: Sam-Hyo Hong, Spänga (SE); Henrik Hoyer, Los Gatos, CA (US); Jeffrey Hume, El Granada, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/530,276

(22) Filed: Sep. 8, 2006

(65) Prior Publication Data

US 2007/0181987 A1    Aug. 9, 2007

Related U.S. Application Data

(63) Continuation of application No. PCT/SE2005/000331, filed on Mar. 7, 2005.

(30) Foreign Application Priority Data

Mar. 9, 2004   (EP)   ................... 04445024

(51) Int. Cl.
*H01L 21/00* (2006.01)
(52) U.S. Cl. ................ 438/125; 257/707; 257/E33.075
(58) Field of Classification Search ................ 438/125; 257/E33.075
See application file for complete search history.

(56) References Cited

U.S. PATENT DOCUMENTS

| 3,648,357 | A | | 3/1972 | Green, Jr. |
| 4,360,965 | A | | 11/1982 | Fujiwara |
| 4,518,112 | A | | 5/1985 | Miller et al. |
| 4,875,617 | A | | 10/1989 | Citowsky |
| 5,353,193 | A | * | 10/1994 | Chia et al. .................. 361/704 |
| 5,384,690 | A | * | 1/1995 | Davis et al. ................. 361/789 |
| 6,027,957 | A | * | 2/2000 | Merritt et al. ............... 438/106 |
| 6,123,865 | A | * | 9/2000 | Lin et al. ....................... 216/91 |
| 2001/0000416 | A1 | * | 4/2001 | Uzoh .......................... 257/781 |
| 2003/0045066 | A1 | * | 3/2003 | Igarashi ...................... 438/350 |
| 2004/0029304 | A1 | | 2/2004 | Naydenkov et al. |
| 2004/0227229 | A1 | * | 11/2004 | Hu et al. ..................... 257/707 |

FOREIGN PATENT DOCUMENTS

| DE | 4025622 | 2/1992 |
| GB | 2221570 | 2/1990 |
| GB | 2300375 | 11/1996 |
| JP | 61056422 | 3/1986 |

* cited by examiner

*Primary Examiner*—Thao X Le
*Assistant Examiner*—Ajay K Arora
(74) *Attorney, Agent, or Firm*—Coats & Bennett, P.L.L.C.

(57) ABSTRACT

In a circuit, an integrated circuit package and methods for attaching integrated circuit dies or discrete power components to flanges of integrated circuit packages, each of the integrated circuit dies is sawed from a wafer. The thickness of the wafer is reduced by mechanical grinding, applying an isotropic wet chemical etching to the wafer to eliminate crystal defects, evaporating adhesion and diffusion barrier metals on the backside of the wafer, evaporating Au and Sn on the backside of the wafer, wherein the weight proportion of Au is equal to or larger than 85%, sawing the wafer into the circuit dies, and soldering each of the circuit dies to a respective flange of an integrated circuit package.

26 Claims, 5 Drawing Sheets

HIGHLY RELIABLE, COST EFFECTIVE AND THERMALLY ENHANCED AUSN DIE-ATTACH TECHNOLOGY

CROSS-REFERENCE TO RELATED APPLICATION

This application is a continuation of co-pending International Application No. PCT/SE2005/000331 filed Mar. 7, 2005, which designates the United States, and claims priority to European application number EP04445024.5 filed Mar. 9, 2004.

TECHNICAL FIELD

The present invention relates to a method for attaching circuit dies, a method for manufacturing a circuit die, a circuit die, a circuit package including such a die and a power module including such a die. More specifically the present invention relates to a circuit die, where said integrated circuit die should be interpreted to include discrete components, such as capacitors, inductors, diodes and resistors, a power module including such an integrated circuit die or discrete component, a package including such an integrated circuit die or discrete component, a method for manufacturing a circuit die, and a method for attaching a circuit die on a heat sink where said circuit is soldered to the heat sink using an Au—Sn soldering alloy.

BACKGROUND

Integrated circuits are, in broad terms, manufactured by processing a front side of an integrated circuit wafer comprising a multitude of integrated circuit dies or discrete power transistors or capacitors. The individual integrated circuits are then sawed from the wafer and mounted in an integrated circuit package, the connectors on the die are bonded to respective connectors on the package and the package is then sealed and ready for shipping.

One way of attaching a circuit die to a package is by soldering the backside of the die to a flange of the package. Mounting of the die in the package comprises specific problems when the integrated circuit is a power device, since such devices produce a significant amount of heat and therefore are exposed to thermal mismatch and stress. When the die, solder and flange expand or contract differently due to the cooling after soldering or generated heat, delamination can occur if the induced stress is too large, thereby ruining the device. It is thus important that the die, solder, flange, window frame and lead frame react approximately the same to a change in temperature, that is, has approximately similar coefficient of thermal expansion (CTE). Obviously the size of the die is of great importance since a larger die will experience larger thermal mismatch and stress for the same temperature. Thus, for large dies thermal mismatch can be a problem, when the die is a power device, such as RF power transistors.

It is also important that the die, solder and flange can dissipate the generated heat, that is, that the die, solder and flange are good thermal conductors. The better heat is dissipated through the solder and flange, the better the chip will operate and thus it is possible to reduce junction temperature and avoid so-called hotspots. It is necessary to thin the die as much as possible because the semiconductors, in general, are poorer thermal conductors than the solder and the flange. Since power devices also generate large currents, and that these currents will, at least for some designs, go through the solder and flange, it is also important that the solder and flange have as low resistivity as possible.

It is of course not possible to completely avoid thermal mismatching and stress since devices consisting of different material should be attached to each other. Therefore it is important that the die is attached to the flange with such strength that the attachment can withstand the stress induced by the thermal mismatch without impairing the quality of the connection between the die and the flange with respect to thermal and electric conductivity. One great factor affecting the thermal conduction and hotspots on the die is formation of voids in the solder.

Standard ceramic packages, flanges and ceramic window frames for power devices consists of CuW, having 80-90 weight percent wolfram and uses an AuSi eutectic alloy to achieve rather good thermal matching, see table 1. The attachment of the die is conventionally performed by an AuSi eutectic die-attach, which unfortunately oftentimes causes sever void problems with a large die. The AuSi eutectic die-attach can moreover induce strong stress on the die, which limits the size and thickness of the die. Thinner die is desirable since better heat conduction from the die to the solder and flange is achieved.

The CuW flanges have inferior thermal conductivity and is more expensive compared to CuZr flanges, with Zr=0.1 weight percent, Olin 151™. The CTE for CuZr flanges matches the CTE for AuSn, which could be used as solder. AuSn further has superior thermal and electrical conductivity and compared to AuSi. Furthermore, a lower soldering temperature can be used with the AuSn solder compared to the AuSi eutectic alloy. This will reduce the induced stress.

It should be noted that even if CuZr is primarily discussed in this specification other type of heat sink materials with better thermal conductivity than CuW, could be used, specifically materials using powder metallurgy such as PCM or CPC. PCM stands for Powder Copper Molybdenum, with 30-40 weight % Cu infiltration onto the powder Mo, and CPC stands for Copper-PCM-Copper and is a laminate of copper and PCM and copper. The layers are clad under heat and pressure by rolling to form the CPC with certain thickness combinations, for example CPC(141), CPC(232), where the number stands for the thickness proportion between the different layers. Even a pure Copper heat sink is applicable, however the CuZr alloy is more stable with respect to mechanical and electrical properties than the pure copper.

Thus, it seems obvious to use CuZr as flange and AuSn as solder. However, it has hitherto been impossible to find a method for producing strong adhesion using AuSn for larger dies and for power devices, at least partly due to formation of voids and/or delamination between the die and solder where the greatest thermal mismatch and interface instability occur, see table 1.

TABLE 1

Comparison between AuSn and AuSi die attach technologies.

| Property | AuSn | AuSi | Si |
|---|---|---|---|
| Thermal Conductivity (W/m*° K) | 57 | 27 | 15 |
| Thermal Conductivity, Flange | 360 CuZr, Zr = 0.1 weight percent | ~180 CuW, W = 90 weight percent | |

TABLE 1-continued

Comparison between AuSn and AuSi die attach technologies.

| Property | AuSn | AuSi | Si |
|---|---|---|---|
| Resistivity ($\mu\Omega$ * cm) | ~12 | ~25 | ~20 k$\Omega$ * cm |
| Eutectic Point (° C.) | ~280 | ~370 | |
| CTE (ppm/° C.) | 16 | 12 | ~4 |
| CTE, Flange | 17 CuZr | ~8 CuW | |
| CTE for Window Frame | 20-300 Polymers | ~6 (Al$_2$O$_3$) | |
| Young's Modulus (GPa = $10^9$ N/m$^2$) | 59.2 | 82.7 | 187 |

SUMMARY

In a method for attaching integrated circuit dies to flanges of integrated circuit packages, each of the integrated circuit dies is sawed from a wafer. The method may comprise the steps of: reducing the thickness of the wafer by mechanical grinding, applying an isotropic wet chemical etching to the wafer to eliminate crystal defects generated by grinding, evaporating adhesion and diffusion barrier metals on the backside of the wafer, evaporating Au and Sn on the backside of the wafer, wherein the weight proportion of Au is equal to or larger than 85%, sawing the wafer into the circuit dies, and soldering each of the circuit dies to a respective flange of an integrated circuit package.

Further characteristics of the invention and advantages thereof will be evident from the following detailed description of embodiments of the invention.

BRIEF DESCRIPTION OF THE DRAWINGS

The present invention will become more fully understood from the detailed description of embodiments of the present invention given herein below and the accompanying FIGS. 1-6, which are given by way of illustration only, and thus are not limitative of the present invention.

DETAILED DESCRIPTION

Figure 1:
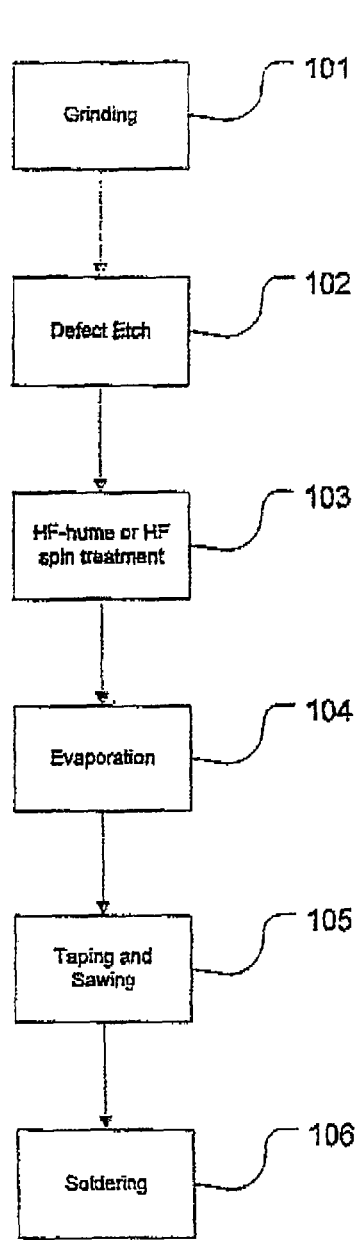
FIG. 1 is a schematic flow diagram of an embodiment.

An apparatus and method according to an embodiment may enable the use of AuSn as solder for attaching integrated circuit dies to Cu, CuZr, CPC or PCM flanges. An apparatus and method according to an embodiment may enable the use of AuSn circuit dies to Cu, CuZr, CPC or PCM heat sinks as modules on circuit boards, and may also be applicable to a concept of COB technique (Chip On Board), with the mentioned heat sink materials, which are covered with Ni or NiCo alloys as a diffusion barrier and a plated gold layer on top. An apparatus and method according to an embodiment may reduce formation of voids when attaching integrated circuit dies to flanges of integrated circuit packages, power modules or power amplifiers using the COB concept, and may also be corrosion resistant. An apparatus and method according to an embodiment may provide cost effective packages for power devices. An apparatus and method according to an embodiment may provide the possibility to use flanges having higher thermal and electrical conductivity. An apparatus and method according to an embodiment may enhance device reliability by providing lower junction temperature and reduced hotspot problems through increased thermal conductivity. An apparatus and method according to an embodiment may enhance thermal and electrical conductivity by providing the possibility to use thinner integrated circuit dies and to thereby increase device reliability and performance. An apparatus and method according to an embodiment may reduce stress on the integrated circuit die, which enables using larger dies without formation of cracks. An apparatus and method according to an embodiment may increase the die shear strength. An apparatus and method according to an embodiment may prevents or at least reduces delamination problems.

According to a second aspect, in a method for manufacturing an integrated circuit die to be attached to a flange of an integrated circuit package, the integrated circuit dies is sawed from a wafer. The method may comprise the steps of: reducing the thickness of the wafer by mechanical grinding, applying an isotropic wet chemical etching to the wafer to eliminate crystal defects, evaporating adhesion and diffusion barrier metals on the backside of the wafer, evaporating Au and Sn on the backside of the wafer, wherein the weight proportion of Au, is equal to or larger than 85%, and sawing the wafer into circuit dies.

By applying an isotropic wet chemical etching to the wafer, crystal defects are removed. This will in turn achieve a very elastic wafer, which will not break during sawing of the wafer into dies. To fully cover the rather rough surface of the CuZr flange a rather thick solder of 4-10 µm is needed. This thick solder causes heavy bending of the thinned wafer. During sawing of the wafer into dies it is important that the wafer is absolutely planar and therefore the wafer is made flat by vacuum sucking to a chuck. If the wafer is not elastic, but rather brittle, it will break during this planarization process. Complete elimination of the crystal defects makes it possible to flatten the wafer without breakage.

According to a third aspect, an integrated circuit die can be manufactured according to the second aspect of the invention.

According to a fourth aspect, an integrated circuit die may comprise a layer of adhesion and diffusion barrier metals on a backside of the die to be attached to a flange of an integrated circuit package, a stack of alternating layers of Au and Sn, where a first layer in the stack, which closest to the layer of diffusion barrier metals is an Au layer and the final layer in the stack is an Au layer. The integrated circuit die may be characterized in that the weight percentage of Au in relation to Sn in the stack is equal to or higher than 85%.

According to a fifth aspect, an integrated circuit package may comprise a flange and an integrated circuit according to the third or fourth aspect of the invention, wherein the flange is made of an alloy of Cu and Zr.

A package having a flange of CuZr can be more cost effective than other traditional packages and has superior electrical and thermal characteristics.

According to a variant a rough etching may be applied to the Si after the isotropic wet chemical etching to roughen the Si surface. According to yet a variant a round up etch may be applied after the rough etching to eliminate sharp re-entrant peaks.

The rough etching achieves a mechanical interlocking function and increases the contact area between the Si and the adhesion metals, such as Ti. This eliminates or at least further reduces the risk of delamination and increases the adhesion effect. The elimination of sharp re-entrant peaks removes "shadows" on the Si surface. Such "shadows" may render it more difficult to completely cover the Si surface with the adhesion metal during evaporation.

According to a variant the step of applying an isotropic wet chemical etching may remove at least 25 µm, preferably 30 µm, of the wafer backside.

According to a variant the integrated circuit die may be less than 150 µm thick, preferably approximately 40 µm to 80 µm.

According to a variant the flange may be an alloy of Cu and Zr.

According to a variant evaporating a first Au layer, an Sn layer and a second Au layer may perform the step of evaporating Au and Sn on the backside of the wafer. According to yet a variant the final layer of Au in the stack may be thick enough to produce a smooth surface to facilitate release from an UV curable sawing tape, to obtain a residue free, clean Au surface, and to ensure full coverage of the Sn surface to prevent tin oxide formation.

Conventional techniques generally use several layers in a stack to achieve mixture between the metals. According to the embodiments, fewer layers may be used, thereby reducing the Kirkendall voids. Furthermore, this can mean that a thicker Au layer is achieved adjacent to the diffusion barrier metals. This will prevent, or at least reduce, migration of Sn towards the diffusion barrier metals, thereby further reducing the risk of erosion of the diffusion barrier metals and thus prevent delamination.

Common diffusion barrier metals, such as Pt, Ni, Pd, Cr etc, can form inter-metallic alloys with Sn. Thus, the diffusion barrier metals can be resolved in the AuSn solder and thus erode the barrier causing delamination. The method may prevent formation of inter-metallic alloys between the Sn in the AuSn solder and the diffusion barrier metals thereby substantially increasing the reliability and high temperature operation of the device.

According to a variant the final layer of Au may be approximately between 0.5 and 1.0 µm thick.

By having a final Au layer, as anti-oxidation layer, and making this layer thick enough, release of the sawing tape from the die may be facilitated, since a smoother face is achieved by the Au layer compared to the rough polycrystalline structure of the Sn. The smoother Au surface can achieve a polymer residue free surface, which in turn may at least reduce formation of voids.

According to a variant evaporating a first Au layer and an Sn layer may perform the step of evaporating Au and Sn on the backside of the wafer.

According to a variant the first Au layer may be so formed that at least a part of the first Au layer, being adjacent to the diffusion barrier metals layer, retain solid state during the step of soldering the circuit die to the flange.

During soldering the temperature may be above the melting point for Sn of 232 degrees Celsius, which will then start to form inter-metallic alloys with the Au, such as AuSn and $Au_5Sn$, which each has a lower melting temperature than Au. Au will migrate rapidly into the molten Sn layer from both sides, that is, the Au layer adjacent to the diffusion barrier metals and also from the Au layer on the package flange. Thus a solder can be achieved, attaching the circuit die onto the package flange. However, the Au layer adjacent to the diffusion metals layer may be so thick that the diffusion of solid Au into the molten Sn layer, or the Au and Sn liquid mixture, forming an eutectic alloy at approximately 280 degrees Celsius, is not complete and since the temperature, which is less than 340 degrees Celsius, during soldering may not ever reach the melting point for Au, being 1063 degrees Celsius, or for an Au rich mixture of Au and Sn, compared to the eutectic composition of Au and Sn, the part of the layer adjacent to the diffusion barrier metals is kept intact. Thereby, the Sn is not allowed to reach and erode the diffusion barrier metals. The eutectic composition of Au and Sn comprises 80 weight percent Au and 20 weight percent Sn.

According to a variant the first layer of Au may be approximately 3 µm to 6 µm, preferably 5 µm thick.

According to a variant the flange may comprise a layer of plated Au, being 0.4 to 2.5 µm thick, which, together with the Au and Sn layers on the die during the step of soldering forms an alloy being Au richer than the eutectic composition. The Au rich alloy may comprise between 86 and 89 weight percent Au.

According to a variant the step of evaporating adhesion and diffusion barrier metals may comprise evaporating a Ti layer and evaporating a Pt layer on the backside of the wafer.

In the following description, for purposes of explanation and not limitation, specific details are set forth, such as particular techniques and applications in order to provide a thorough understanding of the present invention. However, it will be apparent to one skilled in the art that the present invention may be practiced in other embodiments that depart from these specific details. In other instances, detailed descriptions of well-known methods and apparatuses are omitted so as not to obscure the description of the present invention with unnecessary details.

FIG. 1 is a schematic flow diagram of an embodiment disclosing the different steps in the process flow. In step 101 the wafer is thinned, using a DISCO mechanical grinding tool, from approximately 525 or 675 µm to a wafer thickness which is approximately 30 µm thicker than the final die thickness, in the present embodiment approximately 110 µm. Secondly a defect etch of approximately 30 µm is performed in step 102. The roughness of the surface is controlled by a SEZ chemical etcher. The final thickness of the Si wafer is approximately 80 µm. For some applications it can be foreseen that the final thickness need to be as small as 40 µm. The defect-etch removes crystal defects and achieves an elastic Si wafer. This is important since, during the evaporation stage, the evaporated metals on the Si wafer will make it bend rather much dependent on the wafer thickness and the solder metal stack composition and total thickness. During the sawing of the wafer into dies the wafer needs to be absolutely flat and, if the wafer is brittle it will break during the flattening process. By performing the defect-etch the wafer is made elastic and it will be possible to flatten it during the sawing.

The roughness is controlled giving a roughness range of 0.4-1.0 μm, so that an increased mechanical interlocking between the metal stack and the roughened Si surface is achieved. The rough Si surface will also increase the contact area between the wafer and the adhesion metal layer. Consequently one can obtain manifold stronger adhesion compared to the flat Si surface. A shear strength of more than 20 kg/5 mm$^2$ has been measured. The defect etch will be further described in connection with FIG. 2.

In step 103 an HF hume treatment is performed to remove native oxide having formed on the Si surface by the oxygen in the ambient air. Alternatively, an HF spin with a diluted solution may be used. The F in the HF hume or HF water solution, also bonds to the Si on the surface and achieves a Si-surface passivation by forming Si—F bonds, which prevent surface oxidation. Evaporation of the adhesion metal, diffusion barrier metal and Au/Sn stack is performed in step 104. This step is further detailed in FIG. 3. After evaporation the wafer is taped on the backside with an UV curable tape and sawed in step 105 and finally the individual dies are soldered to respective package flanges. The soldering is performed in a formic acid or nitrogen ambience at a temperature of 290-320 degrees Celsius for approximately 30 to 150 seconds dependent of the soldering tools used, such as batch-wise or single-package type. Since the solidification temperature is approximately 280 degrees, compared to 370 degrees for soldering with AuSi lower stress is induced on the dies.

Figure 2:
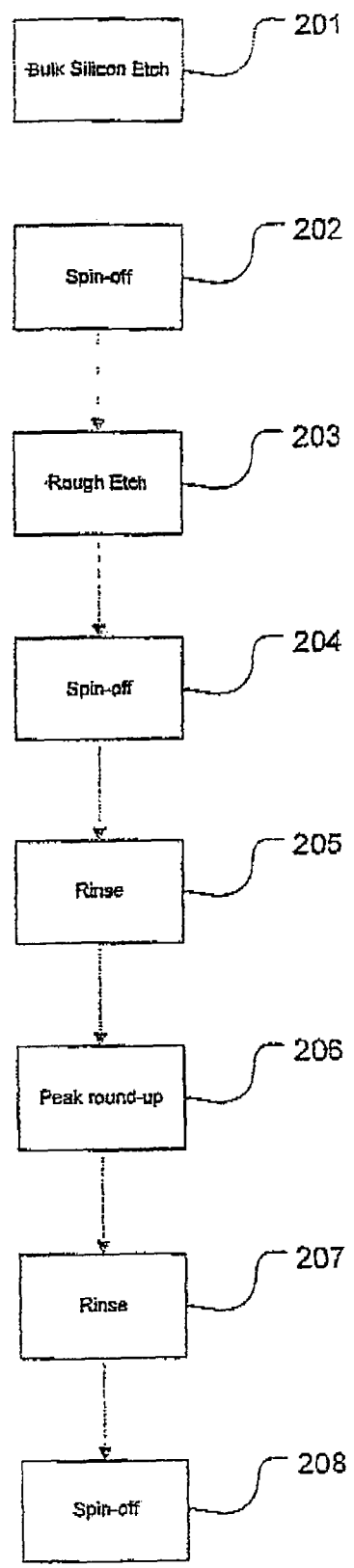
FIG. 2 is a schematic flow diagram of the defect-etching step shown in FIG. 1 in greater detail.

FIG. 2 is a schematic flow diagram of step 102 in FIG. 1, that is the rough defect etch. In step 201 a bulk silicon etch is performed using Spinetch® BT as medium with a flow of 1.2 l/min and at a temperature of 25 degrees Celsius. Step 201 is performed for 40 seconds. At step 202 a spin-off is performed for 3 seconds. At step 201 and 202 the chuck speed is 1400 rpm. For all of the following steps the chuck speed is 700 rpm.

In step 203 a rough etch is performed using 1 part HF, 2 parts $HNO_3$ and 8 parts $H_2SO_4$ as medium with a flow of 1.0 l/min. The temperature in step 203 is set to 55 degrees Celsius and the step is performed for 60 seconds. After that a spin-off step 204 is performed for 3 seconds and a rinse step 205 using DI as medium with a flow of 1.0 l/min is performed for 5 seconds. A peak round-up step 206 using Spinetch® D for medium and with a flow of 1.0 l/min is performed at a temperature of 25 degrees Celsius for 2 seconds. A rinse step 207 using the medium DI with flow 1.0 l/min is performed for 10 seconds and finally a spin-off step 208 with chuck speed 1500 rpm is performed for 10 seconds.

Figure 3:
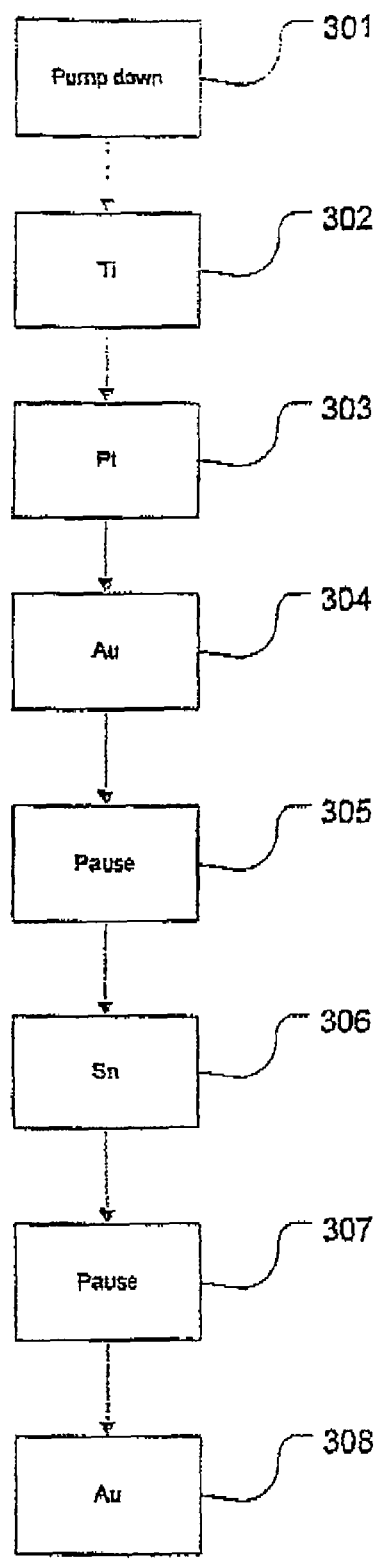
FIG. 3 is a schematic flow diagram of the evaporation step shown in FIG. 1 in greater detail.

FIG. 3 is a schematic flow diagram of the evaporation step 104 in FIG. 1 in more detail. The flow diagram in FIG. 3 discloses the E-beam evaporation of the Ti/Pt/Au/Sn/Au stack, in total 9.1 μm thick. The target composition of the die is Au:Sn=85:15 wt %. The E-beam evaporation is equipped with three Knudsen planetaries, which achieves deposition uniformly with accuracy better than +/−5%, typically +/−3%, in thickness. The deposition efficiency is approximately 50%.

In step 301 the base pressure is pumped down to less than 1.5*10$^{-7}$ mbar by a cryo-pump in order to prevent oxygen induced solder aggregation. In step 302 the adhesion metal layer is added by evaporating a 150 nm thick Ti layer at an evaporation speed of 1.0 nm/s and in step 303 the diffusion barrier metal layer is added by evaporating a 150 nm thick Pt layer at an evaporation speed of 0.5 nm/s. In step 304 a 5000 nm thick Au layer is added, forming the first layer in the solder stack, by evaporation at a speed of 1.0 nm/s. Evaporation induces condensation heat to the wafer and metal stack already on the wafer and so a pause for 20 minutes is performed to let the wafer cool down at step 305. A 2800 nm Sn layer is added in step 306 at an evaporation speed of 1.5 nm/s and another pause of 20 minutes is performed in step 307. Finally an anti-oxidation cap layer is added with a 1000 nm thick Au layer at an evaporation speed of 1.0 nm/s. The wafer temperature is typically below 130 degrees Celsius during the whole deposition process. The E-beam evaporator is also equipped with six quartz crystals to monitor the thickness of the metal deposition accurately.

Figure 4:
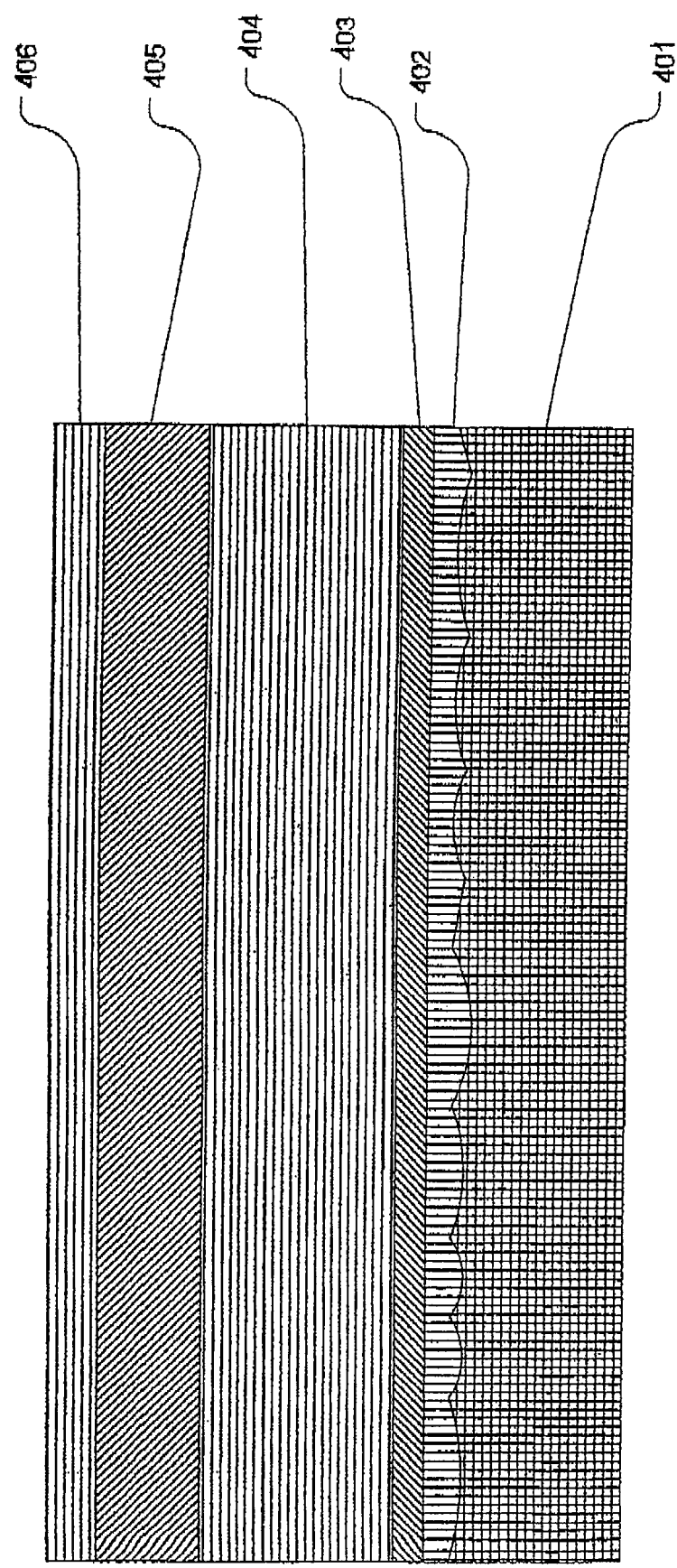
FIG. 4 is a schematic side view of a circuit die.

FIG. 4 is a schematic side view of an integrated circuit die, comprising the metal stack produced according to the methods described earlier. The figure is not to scale. A circuit die 401 having on its backside a first layer of Ti 402 being 150 nm thick. On top of the Ti layer 402 is a 150 nm thick Pt layer 403, a 5000 nm thick Au layer 404, a 2800 nm thick Sn layer 405 and finally a 1000 nm thick Au layer evaporated. The layers 402 to 406 constitute the metal stack.

A thinner metal stack is preferable when the wafer thickness is around or below 60 μm. The thinner metal stack of 6 μm requires a better flatness of the flange. Such a thinner metal stack may be constituted by for instance 100 nm Ti/100 nm Pt/3400 nm Au/1900 nm Sn/700 nm Au, in order from the Si surface and out.

Figure 5:
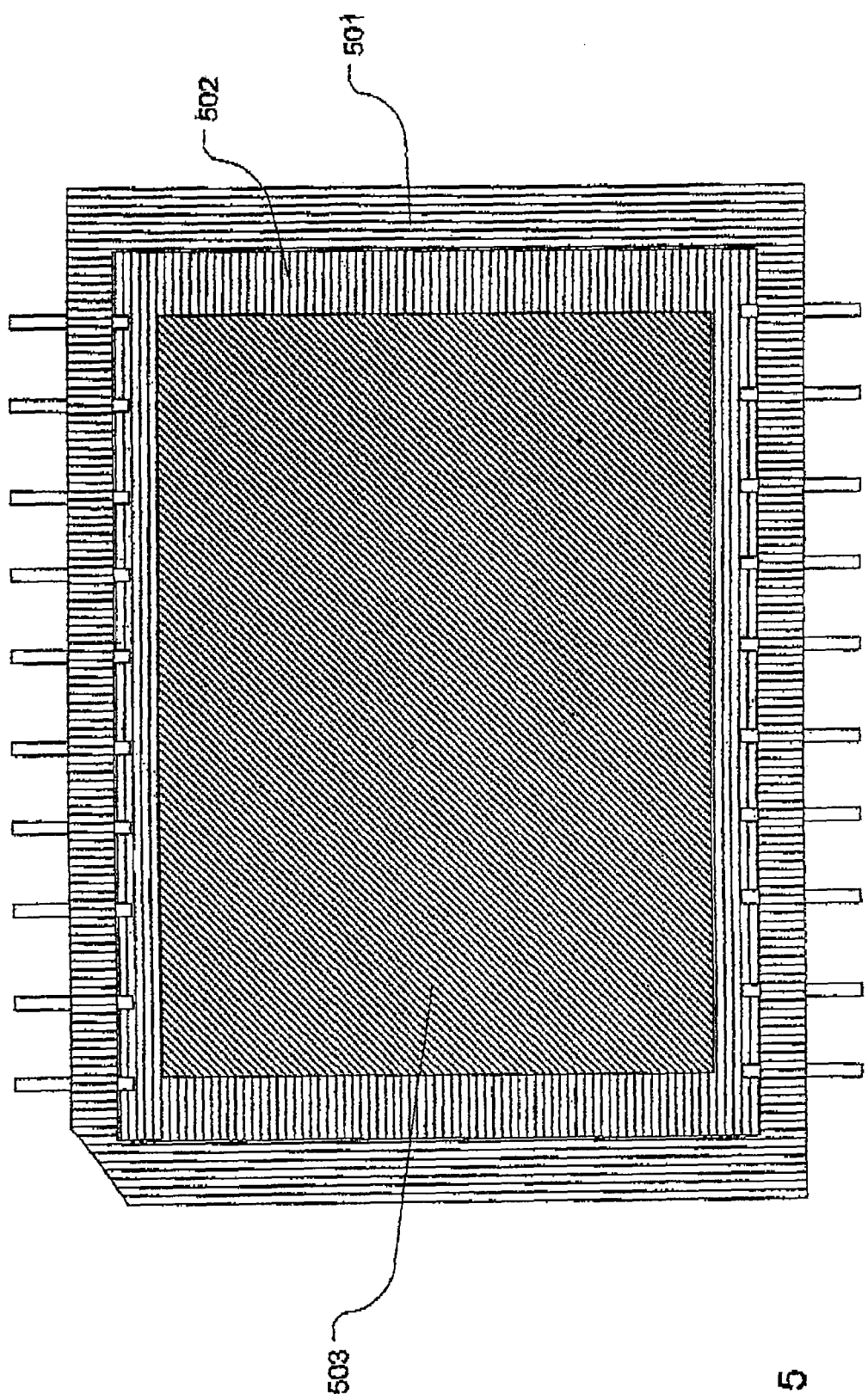
FIG. 5 is a schematic top view of an integrated circuit package comprising an integrated circuit.

FIG. 5 is a schematic top view of a package 501. The package comprises a flange 502 on top of which an integrated circuit die 503 has been soldered.

Figure 6:
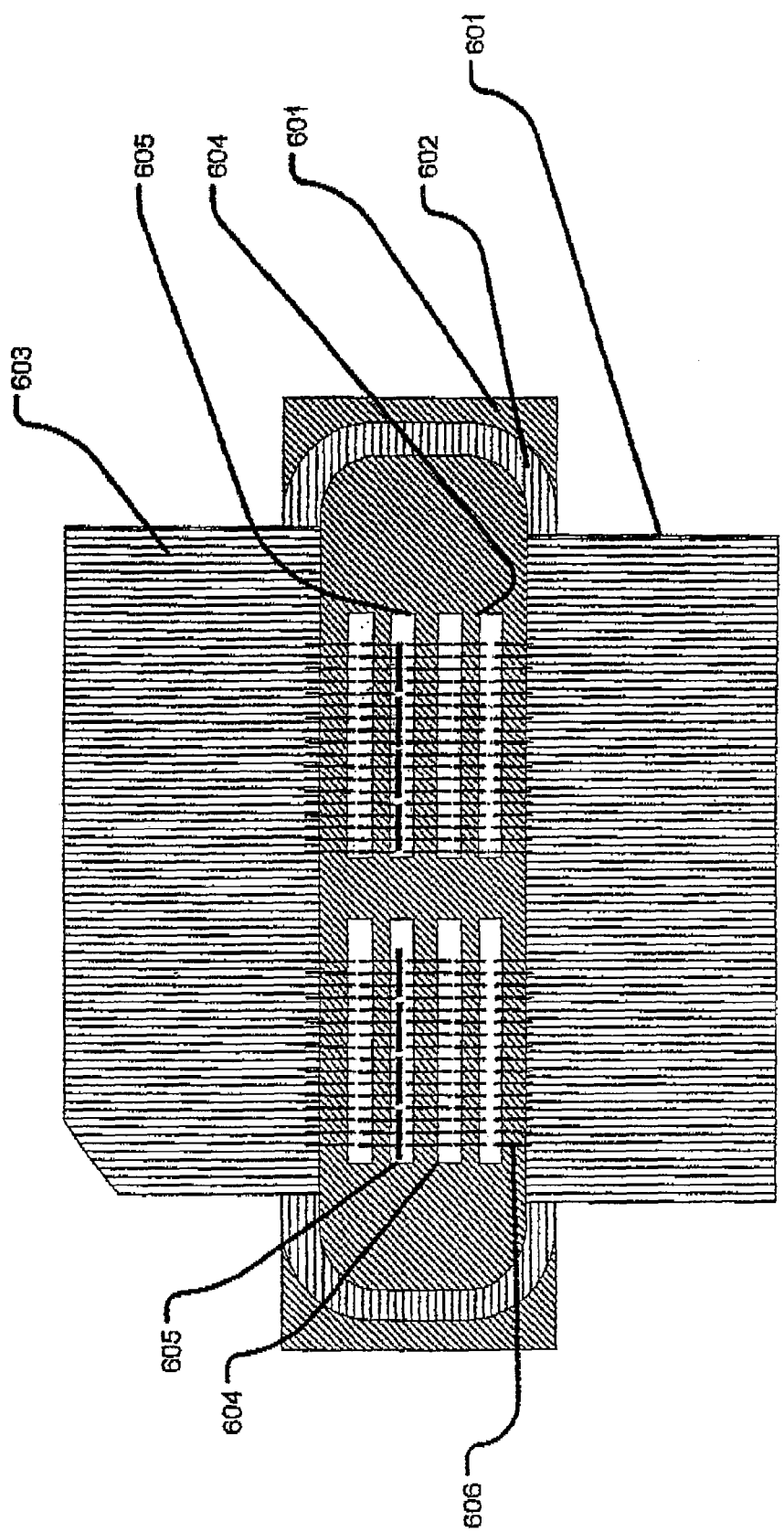
FIG. 6 is a schematic top view of a part of a package comprising circuits and power transistors mounted.

FIG. 6 is a schematic top view of a part of a package. A flange 601 of the package comprises a window frame 602. On the window frame is an external connector 603 mounted. Capacitors 604 are connected through Au wire bonds 606 to power transistors 605 and further to the external connector 603. In this embodiment there are thus several circuits and discrete components, of different kinds, soldered to the flange 601 according to the methods described herein.

It will be obvious that the invention may be varied in a plurality of ways. Such variations are not to be regarded as a departure from the scope of the invention. All such modifications as would be obvious to one skilled in the art are intended to be included within the scope of the appended claims.

What is claimed is:

1. A method for attaching Si circuit dies to heat sinks, wherein each of said dies is sawed from a wafer, comprising the steps of:
    reducing the thickness of said wafer by mechanical grinding;
    applying an isotropic wet chemical etching to a backside of said wafer to eliminate crystal defects;
    evaporating adhesion and diffusion barrier metals on the backside of said wafer;
    evaporating Au and Sn on the backside of the wafer, wherein the weight proportion of Au in relation to the total amount of Au and Sn evaporated on the backside of the wafer is equal to or larger than 85%;
    sawing the wafer into said circuit dies, and soldering each of said circuit dies to a respective heat sink; and
    wherein the Au is deposited adjacent the evaporated adhesion and diffusion barrier metals and has a thickness such that at least a portion of the Au remains solid and does not diffuse when the dies are soldered to the respective heat sinks.

2. A method according to claim 1, wherein said heat sink is a flange of an integrated circuit package.

3. A method according to claim 1, wherein said heat sink is a heat sink on an RF power module or on a printed circuit board.

4. A method according to claim 1, wherein said circuit die is an integrated circuit die, a power transistor or a capacitor, and wherein one or more of said circuit dies is soldered to a respective flange of said package.

5. A method according to claim 1, wherein said isotropic wet chemical etching is an isotropic spin etching.

6. A method according to claim 1, comprising the step of:
applying a roughening spin etching to the Si surface after the isotropic wet chemical etching to roughen the Si surface.

7. A method according to claim 1, wherein said step of applying an isotropic wet chemical etching removes at least 25 µm of said wafer backside.

8. A method according to claim 1, wherein said heat sink is pure Cu or an alloy of Cu and Zr or a Copper-Powder Copper Molybdenum-Copper (CPC) material or a Powder Copper Molybdenum (PCM) material.

9. A method according to claim 1, wherein the step of evaporating Au and Sn on the backside of the wafer is performed by evaporating a first Au layer, an Sn layer and a second Au layer.

10. A method according to claim 1, wherein the step of evaporating Au and Sn on the backside of the wafer is performed by evaporating a first Au layer and an Sn layer.

11. A method according to claim 10, wherein said heat sink comprises a layer of plated Au which, together with the An and Sn layers on the wafer during the step of soldering forms an Au richer solder, than the eutectic composition of Au and Sn, with 80 weight % Au and 20 weight % Sn.

12. A method according to claim 11, wherein said Au richer solder comprises between 86 and 89 weight percent Au.

13. A method according to claim 2, wherein said step of evaporating adhesion and diffusion barrier metals comprises evaporating a Ti layer and evaporating a Pt layer on the backside of said wafer.

14. A method according to claim 6, comprising the step of:
applying a round-up spin etch after the roughening etch to eliminate sharp re-entrant peaks.

15. A method for manufacturing a Si circuit die to be attached to a heat sink, wherein said circuit die is sawed from a wafer, comprising the steps of:
reducing the thickness of said wafer by mechanical grinding;
applying an isotropic wet chemical etching to a backside of the wafer to eliminate crystal defects;
evaporating adhesion and diffusion barrier metals on the backside of said wafer;
evaporating Au and Sn on the backside of the wafer, wherein the weight proportion of Au, in relation to the total amount of Au and Sn evaporated on the backside of the wafer, is equal to or larger than 85%;
sawing the wafer into circuit dies; and
wherein the Au is deposited adjacent the evaporated adhesion and diffusion barrier metals and has a thickness such that at least a portion of the Au remains solid and does not diffuse when the dies are soldered to respective heat sinks.

16. A method according to claim 15, wherein said heat sink is a flange of a circuit package.

17. A method according to claim 15, wherein said heat sink is a heat sink on an Rf power module or on a printed circuit board.

18. A method according to claim 15, wherein said circuit die is an integrated circuit die, a power transistor or a capacitor, and wherein one or more of said circuit dies is soldered to a respective flange of said package.

19. A method according to claim 15, wherein said isotropic wet chemical etching is an isotropic spin etching.

20. A method according to claim 15, comprising the step of:
applying a roughening etch to the Si after the isotropic wet chemical etching to roughen the Si surface.

21. A method according to claim 15, wherein the step of evaporating Au and Sn on the backside of the wafer is performed by evaporating a first Au layer, a Sn layer and a second Au layer.

22. A method according to claim 21, further comprising soldering the circuit die to said heat sink, wherein said first Au layer is so formed that at least a part of said first Au layer, being adjacent to a Pt layer, retains solid state during said step of soldering the circuit die to said heat sink.

23. A method according to claim 15, further comprising soldering the circuit die to a flange of a circuit package, wherein said flange comprises a layer of plated Au which, together with the Au and Sn layers on the die during the step of soldering forms an Au richer solder.

24. A method according to claim 23, wherein said Au richer solder comprises between 86 and 89 weight percent Au.

25. A method according to claim 15, wherein said step of evaporating adhesion and diffusion barrier metals comprises evaporating a Ti layer and evaporating a Pt layer on the backside of said wafer.

26. A method according to claim 20, comprising the step of:
applying a round-up etch after the roughening etch to eliminate sharp re-entrant peaks.

\* \* \* \* \*